(12) United States Patent
Park et al.

(10) Patent No.: US 7,491,447 B2
(45) Date of Patent: Feb. 17, 2009

(54) DOUBLE-SIDED METALLIC LAMINATE AND METHOD FOR MANUFACTURING THE SAME

(75) Inventors: Soon-yong Park, Daejeon (KR); You-jin Kyung, Seoul (KR); Heon-sik Song, Daejeon (KR); Byeong-in Ahn, Daejeon (KR); Joo-eun Ko, Seoul (KR); Yong-jun Park, Daejeon (KR); Se-myung Jang, Jeonju-si (KR)

(73) Assignee: LG Chem, Ltd., Seoul (KR)

( * ) Notice: Subject to any disclaimer, the term of this patent is extended or adjusted under 35 U.S.C. 154(b) by 137 days.

(21) Appl. No.: 10/550,582

(22) PCT Filed: Mar. 25, 2004

(86) PCT No.: PCT/KR2004/000666

§ 371 (c)(1), (2), (4) Date: Jun. 26, 2006

(87) PCT Pub. No.: WO2004/085146

PCT Pub. Date: Oct. 7, 2004

(65) Prior Publication Data

US 2007/0042202 A1  Feb. 22, 2007

(30) Foreign Application Priority Data

Mar. 26, 2003 (KR) .................. 10-2003-0018811
Mar. 26, 2003 (KR) .................. 10-2003-0018812

(51) Int. Cl. *B32B 15/08* (2006.01)

(52) U.S. Cl. .................. 428/458; 428/473.5; 427/384; 156/307.5

(58) Field of Classification Search .................. None
See application file for complete search history.

(56) References Cited

U.S. PATENT DOCUMENTS

| 4,937,133 A | * | 6/1990 | Watanabe et al. ........... 428/209 |
| 5,112,694 A | | 5/1992 | Konotsune et al. |
| 5,298,331 A | * | 3/1994 | Kanakarajan et al. ....... 428/458 |

FOREIGN PATENT DOCUMENTS

| EP | 496334 A1 | * | 7/1992 |
| JP | 01-244841 | | 9/1989 |
| WO | WO 88/00428 | | 1/1988 |
| WO | WO 0132418 | | 5/2001 |

\* cited by examiner

*Primary Examiner*—Monique R Jackson
(74) *Attorney, Agent, or Firm*—McKenna Long & Aldridge LLP

(57) ABSTRACT

The present invention relates to a double-sided metallic laminate for a printed circuit board and a method for manufacturing the same. The double-sided metallic laminate which comprises a metallic layer at one side, a resin layer of a polyimide for improving adhesion with a metal, a resin layer of a low expansion polyimide having a thermal expansion coefficient of $5 \times 10^{-6}$ to $2.5 \times 10^{-5}/°$ C. and a metallic layer at the other side, has excellent flexibility and thermal resistance, can prevent curl and is securely laminated, particularly without the use of an adhesive. Therefore, it is suitable for a printed circuit board of a small size electric appliance.

17 Claims, 2 Drawing Sheets

DOUBLE-SIDED METALLIC LAMINATE AND METHOD FOR MANUFACTURING THE SAME

This application claims priority to PCT/KR2004/000666, filed on Mar. 25, 2004, and Korean Application Nos. 10-2003-0018812 filed Mar. 26, 2003, in Korea, all of which are hereby incorporated by reference in their entirety.

TECHNICAL FIELD

The present invention relates to a double-sided metallic laminate for a printed circuit board and a method for manufacturing the same, and more particularly, a metallic laminate for a circuit board comprising, between two metallic layers, a resin layer of a low expansion polyimide and a resin layer of a thermoplastic polyimide; or a resin layer of a polyimide for improving adhesion with a metal, a resin layer of a low expansion polyimide and a resin layer of a thermoplastic polyimide, which has excellent flexibility and thermal resistance, prevents the formation of curl and is securely laminated without the use of an additional adhesive.

BACKGROUND ART

For small size and multi-functions of electric appliances, particularly for lightness, thinness, shortness and small size of portable appliances, there is a demand for high density of a circuit board used in electric appliances and generally, a circuit board is made in a multi-layered structure to meet the demand. Also, a flexible printed circuit base board may be used to be installed in a limited space or a circuit with a narrow line width may be used to produce a large amount of circuits in the same space. Meanwhile, considering the environmental problems caused by soldering for the multi-layered structure, concern about an adhesive to produce the multi-layered structure without using lead is increased and there is a demand for an adhesive with high adhesion, high thermal resistance and low moisture absorption for a circuit board.

The conventional metallic laminate comprising a polyimide film and a metal foil adhered to each other by an acryl or epoxy adhesive is not adequate for a circuit board requiring a multi-layered structure, flexibility, high adhesive power and high thermal resistance. Therefore, there has been developed an adhesive free type flexible metallic laminate which is produced by directly adhering a polyimide and a metal foil without using an adhesive.

Meanwhile, for a high density circuit, a circuit board of a double-sided metallic laminate comprising metal foils laminated at both sides of a polyimide resin is preferred.

Japanese Patent Laid-Open Publication No. Heil-244,841 discloses a method for preparing a double-sided metallic laminate for a printed circuit board using a thermoplastic polyimide having a glass transition temperature exceeding 250° C. Therefore, it has problems in that the lamination of the thermoplastic polyimide on a metal foil is performed under a condition including a high temperature of over 350° C. and a high pressure of over 50 kg/cm².

Also, U.S. Pat. No. 5,112,694 discloses a double-sided metallic laminate, in which a single layer of a polyimide is coated on a metal foil and another metal foil is laminated thereto at a temperature of over 380° C. and a pressure of 20 kg/cm or more. However, this double-sided metallic laminate has problems in that it should be subjected to a high temperature and high pressure condition.

DISCLOSURE OF INVENTION

Accordingly, the present invention has been made in order to solve the foregoing problems, and it is an object of the present invention to provide a metallic laminate for a circuit board securely laminated without the use of an additional adhesive which has high density, flexibility and thermal resistance while preventing curl which often occurs on a laminated board.

It is another object of the present invention to provide a method for manufacturing a metallic laminate for a circuit board securely laminated without the use of an additional adhesive which has high density, flexibility and thermal resistance while preventing curl which often occurs on a laminated board.

In order to achieve the above objects, the present invention provides a double-sided metallic laminate comprising a metallic layer at one side, a resin layer of a low expansion polyimide having a thermal expansion coefficient of $5 \times 10^{-6}$ to $2.5 \times 10^{-5}/°C.$, a resin layer of a thermoplastic polyimide and a metallic layer at the other side.

The low thermal expansion polyimide may be the following formula 1.

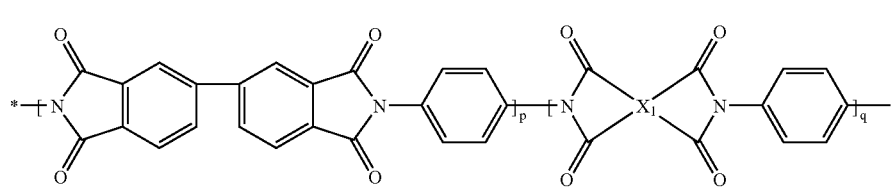

[formula 1]

In the formula 1, p>1, q>0 and p/q=0.4~2.5, $X_1$ is

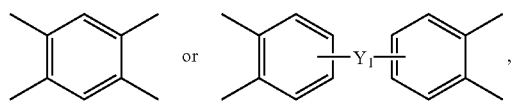

and $Y_1$ is —O— or —CO—.

The thermoplastic polyimide may have a glass transition temperature of 200 to 250° C.

The thermoplastic polyimide may be a copolymer including the following formula 2a, formula 2b, formula 2c and formula 2d.

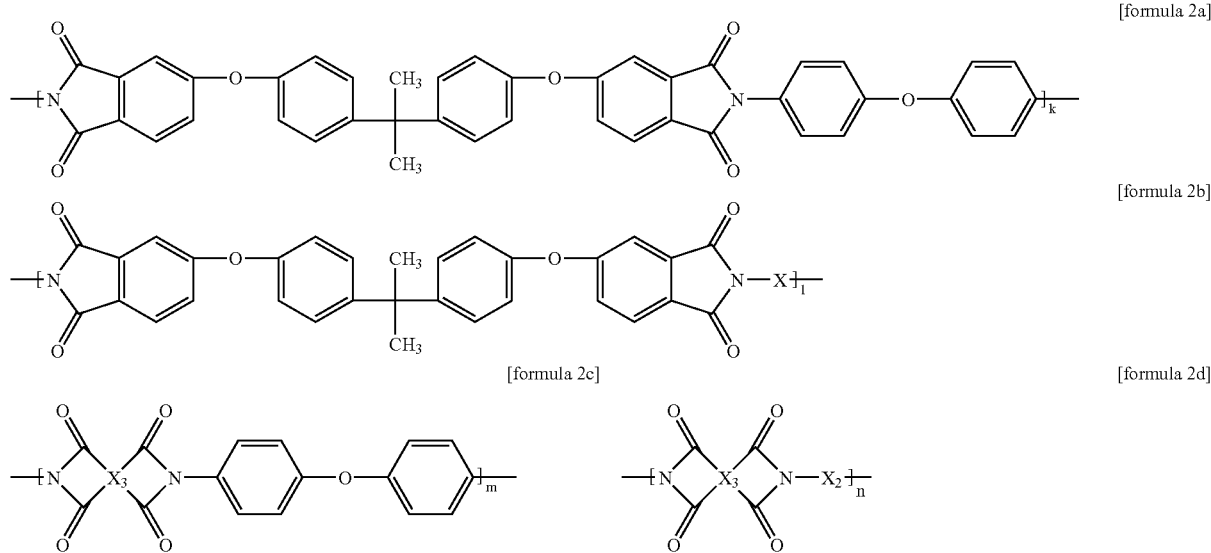

[formula 2a]

[formula 2b]

[formula 2c]

[formula 2d]

In the formulae 2a to 2d, k≧1, l, m, n≧0, l=m=n≠0, k≧1, k+l>1.5 (m+n) and k+m>1.5 (l+n), $X_2$ is at least one selected from the group consisting of

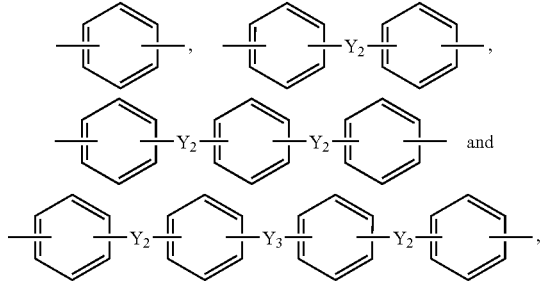

and $Y_2$ and $Y_3$ are each independently or simultaneously -, —O—, —CO—, —S—, —SO$_2$—, —C(CH$_3$)$_2$— or —CONH—, $X_3$ is

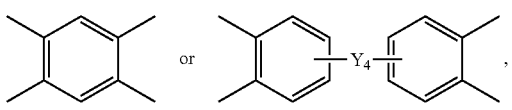

and $Y_4$ is -, —O— or —CO—.

The thermoplastic polyimide may be the formulae 2a to 2d, in which m, n=0 and $X_2$ is the following formula 3.

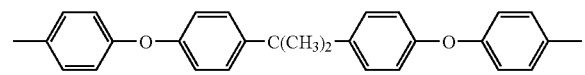

[formula 3]

The thermoplastic polyimide may be the formulae 2a to 2d, in which m, n=0 and $X_2$ is the following formula 4.

[formula 4]

The metallic layer may be formed of copper.

The double-sided metallic laminate may further comprise a resin layer of a polyimide between the metallic layer at one side and a resin layer of a low expansion polyimide for improving adhesion with a metal.

The polyimide for improving adhesion with a metal is a polyimide having a —NH— functional group introduced.

The polyimide for improving adhesion with a metal is a polyimide having the following formula 5 introduced.

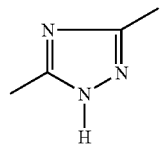

[formula 5]

The polyimide for improving adhesion with a metal is a copolymer including the formula 2a, formula 2b, formula 2c and formula 2d.

Also, the present invention provides a method for manufacturing a double-sided metallic laminate comprising simultaneously or sequentially applying a precursor of a low thermal expansion polyimide having a thermal expansion coefficient of 5×10–6 to 2.5×10–5/° C. and a precursor of a thermoplastic polyimide on a metal foil to form one side of the double-sided metallic layer, followed by drying and curing, and laminating another metal foil on the resin layer of a thermoplastic polyimide of the resulting one-sided metallic laminate comprising a metal foil layer, a resin layer of a low expansion polyimide and a resin layer of a thermoplastic polyimide, which are sequentially laminated, to form the other side of the double-sided metallic laminate.

The precursor of a low thermal expansion polyimide may be a copolymer of the following formula 6.

[formula 6]

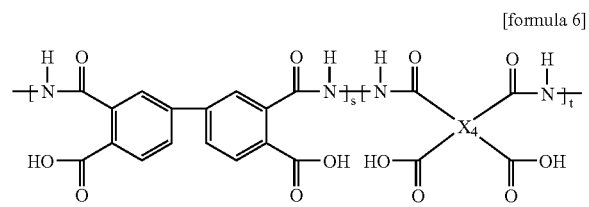

In the formula 6, s>1, t>0 and s/t=0.4~2.5,
$X_4$ is

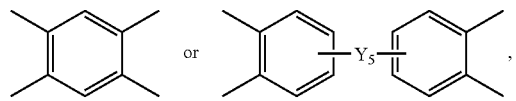

and
$Y_5$ is -, —O— or —CO—.

The thermoplastic polyimide may have a glass transition temperature of 200 to 250° C.

The precursor of a thermoplastic polyimide may be a copolymer including the following formula 7a, formula 7b, formula 7c and formula 7d.

In the formulae 7a to 7d, $k \geqq 1$, l, m, $n \geqq 0$, $l=m=n \neq 0$, $\geqq 1$, k+l>1.5(m+n) and k+m>1.5(l+n)

$X_2$ is at least one selected from the group consisting of

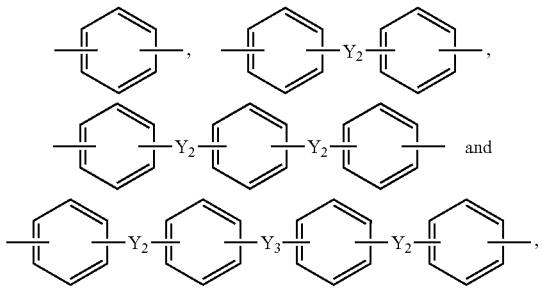

$Y_2$ and $Y_3$ are each independently or simultaneously -, —O—, —CO—, —S—, —$SO_2$—, —$C(CH_3)_2$— or —CONH—,
$X_3$ is

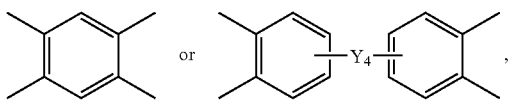

and
$Y_4$ is -, —O— or —CO—.

The precursor of a thermoplastic polyimide may be the formulae 7a to 7d, in which m, n=0 and $X_2$ is the formula 3.

The precursor of a thermoplastic polyimide may be the formulae 7a to 7d, in which m, n=0 and $X_2$ is the formula 4.

The precursor applied on the metal film at one side of the double-sided metallic layer may be a precursor of a polyimide

[formula 7a]

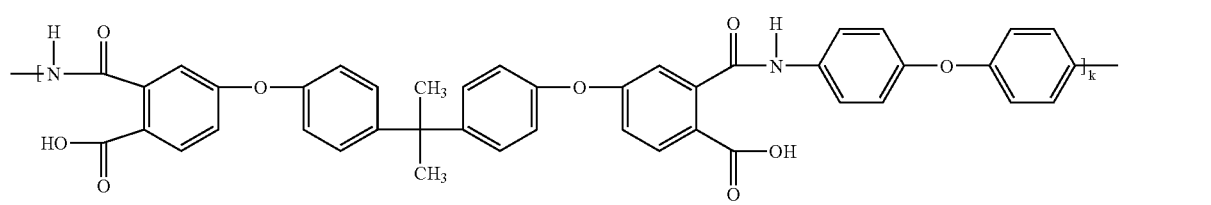

[formula 7b]

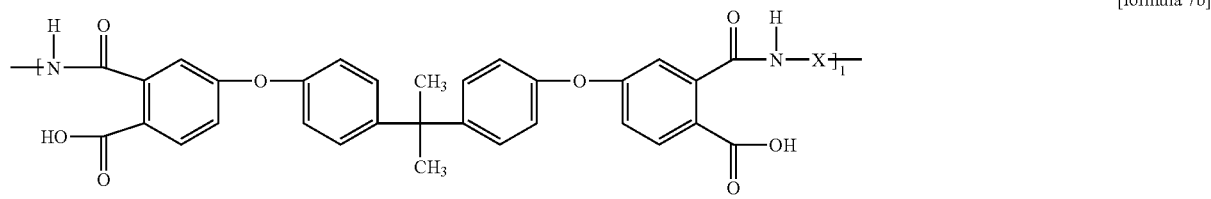

[formula 7c]                                    formula 7d

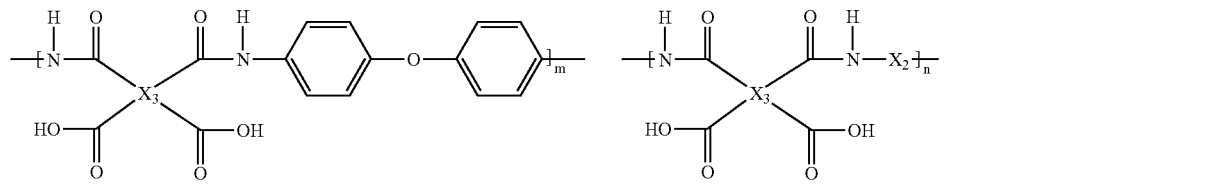

for improving adhesion with a metal, precursor of a low thermal expansion polyimide having a thermal expansion coefficient of 5×10–6 to 2.5×10–5/° C. and a precursor of a thermoplastic polyimide.

The precursor of a polyimide for improving adhesion with a metal is a precursor of a polyimide having a —NH— functional group introduced.

The precursor of a polyimide for improving adhesion with a metal is a precursor of a polyimide having the formula 5 introduced.

The precursor of a polyimide for improving adhesion with a metal is a copolymer including formula 7a, formula 7b, formula 7c and formula 7d.

BRIEF DESCRIPTION OF DRAWINGS

Further objects and advantages of the invention can be more fully understood from the following detailed description taken in conjunction with the accompanying drawings in which.

BEST MODE FOR CARRYING OUT THE INVENTION

Figure 1:
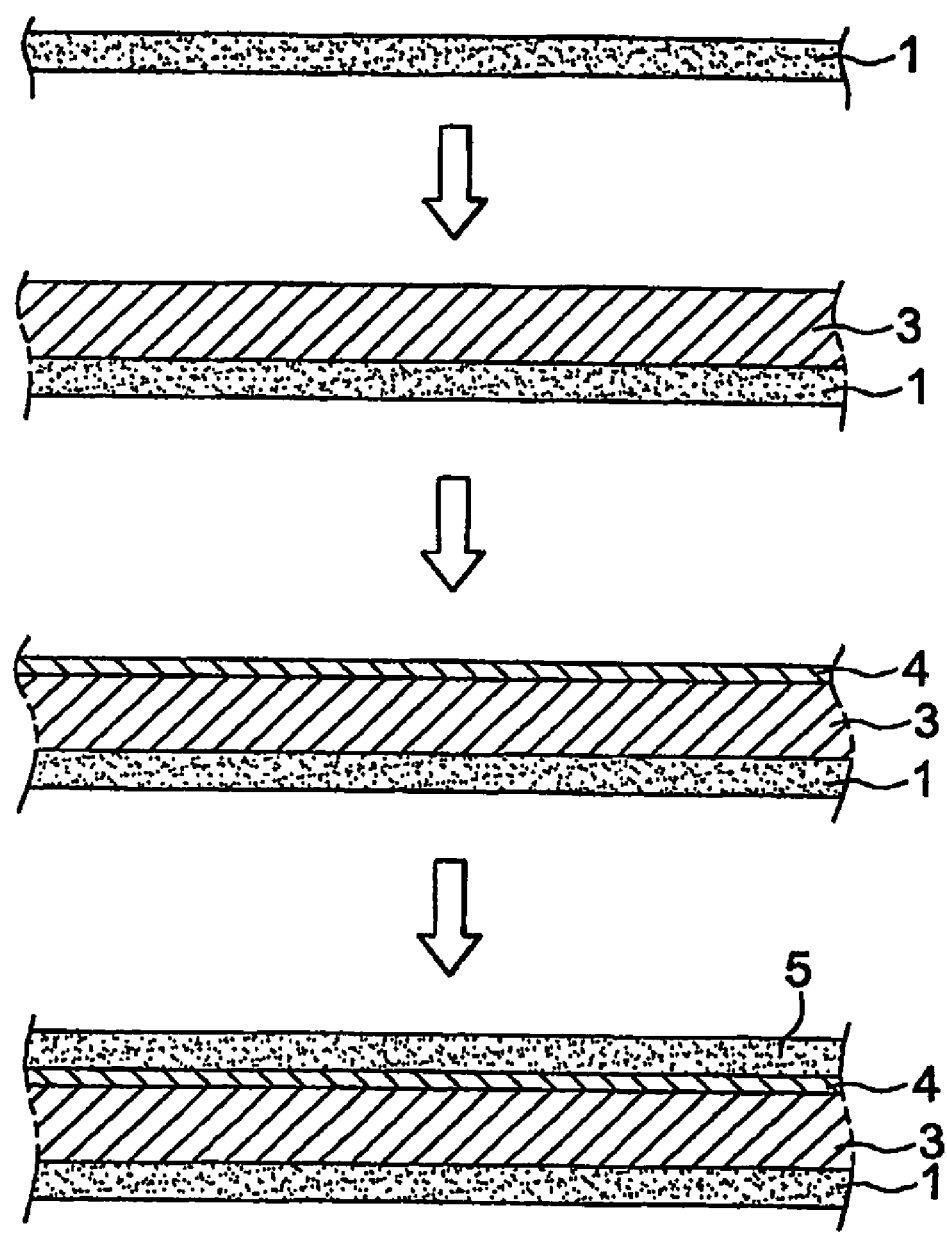
FIG. 1 schematically shows the process for preparing a double-sided metallic laminate by sequentially laminating a metal foil layer 1 of one side, a resin layer of a low expansion polyimide 3, a resin layer of a thermoplastic polyimide 4 and a metal foil layer 5 of the other side, according to the present invention.
Figure 2:
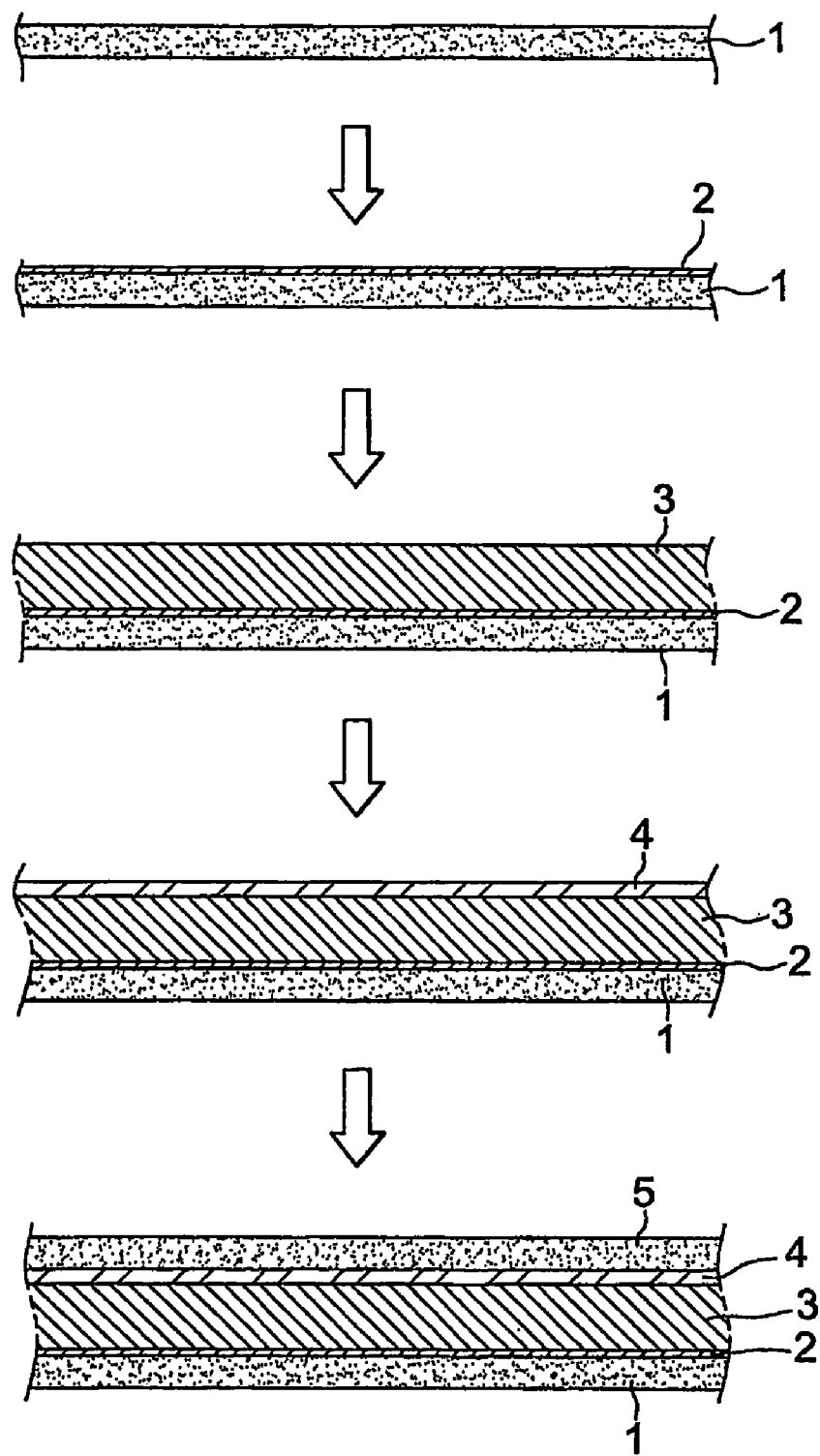
FIG. 2 schematically shows the process for preparing a double-sided metallic laminate by sequentially laminating a metal foil layer 1 of one side, a resin layer of a polyimide 2 to increase the adhesion, a resin layer of a low expansion polyimide 3, a resin layer of a thermoplastic polyimide 4 and a metal foil layer 5 of the other side, according to the present invention.

Now, the present invention will be described hereinafter in detail.

The double-sided metallic laminate according to the present invention is to provide a circuit board for a high density printed circuit board having flexibility and thermal resistance so that it can be installed in a limited space, which comprises polyimide type resin layers laminated between two metallic layers. Particularly, in order to provide a circuit board which prevents curl and is securely laminated without the use of an adhesive, it is characterized in that a resin layer of a low expansion polyimide and a resin layer of a thermoplastic polyimide are laminated between two metallic layers.

According to the present invention, polyimide type resin layers are selected to provide a metallic laminate having excellent flexibility and thermal resistance so that it can be installed in a limited small space.

Also, in order to prevent curl which may occur on the metallic laminate, the resin layer has a thermal expansion coefficient similar to that of the metal layer. Therefore, the resin layer which is laminated on the metallic layer according to the present invention is a low thermal expansion polyimide having a thermal expansion coefficient of $5 \times 10^{-6}$ to $2.5 \times 10^{-5}/°$ C. If the low thermal expansion polyimide has a thermal expansion coefficient of less than $5 \times 10^{-6}/°$ C., when only one side of the metallic layers is etched, curl with the inside being the metallic layer occurs. If the thermal expansion coefficient exceeds $2.5 \times 10^{-5}/°$ C., when only one side of the metallic layers, curl with the inside being the resin layer occurs. Also, the resin layer of a low expansion polyimide is adhesive before curing into an insulating layer and thus, can be applied on the metal film without an additional adhesive.

The low thermal expansion polyimide is not particularly limited, as long as it has a thermal expansion coefficient of $5 \times 10^{-6}$ to $2.5 \times 10^{-5}/°$ C., but is preferably a polyimide of the following formula 1 due to its low moisture absorption.

[formula 1]

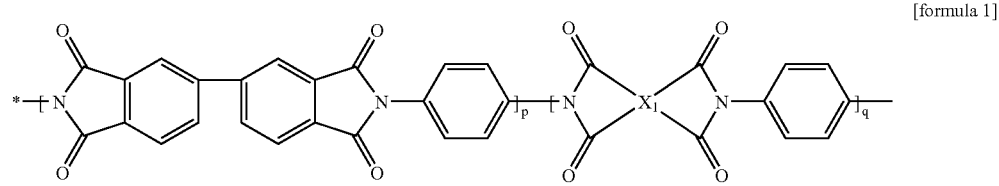

In the formula 1, p>1, q>0 and p/q=0.4~2.5,
$X_1$ is

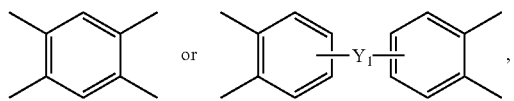

and
$Y_1$ is —O— or —CO—.

In the formula 1, if p/q is less than 0.4, the polyimide is too hard to be suitable for a flexible circuit board to be used in a limited place. Also, since the thermal expansion coefficient exceeds $2.5 \times 10^{-5}/°$ C., when the one side of the metallic layer is etched, curl with the inside being the resin layer occurs. If p/q exceeds 2.5, the polyimide resin layer is easy to break. Also, since the thermal expansion coefficient is excessively great, when the one side of the metallic layer is etched, curl with the inside being the metallic layer occurs.

The above-described low thermal expansion polyimide has a glass transition temperature (Tg) of 400° C. or higher. Therefore, it should be elevated to a temperature of over that to laminate in a metal foil. However, it is difficult to elevate the temperature of a lamination machine to over 400° C. and moreover, the polyimide may be decomposed at a temperature of over 400° C. Therefore, the present invention employs a thermoplastic polyimide resin layer having a glass transition temperature of 200 to 250° C., in addition to the low thermal expansion polyimide resin layer.

The thermoplastic polyimide is not particularly limited as long as it has a glass transition temperature of 200 to 250° C., but is preferably a copolymer including the formulae 2a, 2b, 2c and 2d since the adhesion requirement is not complicated and the adhesion is excellent.

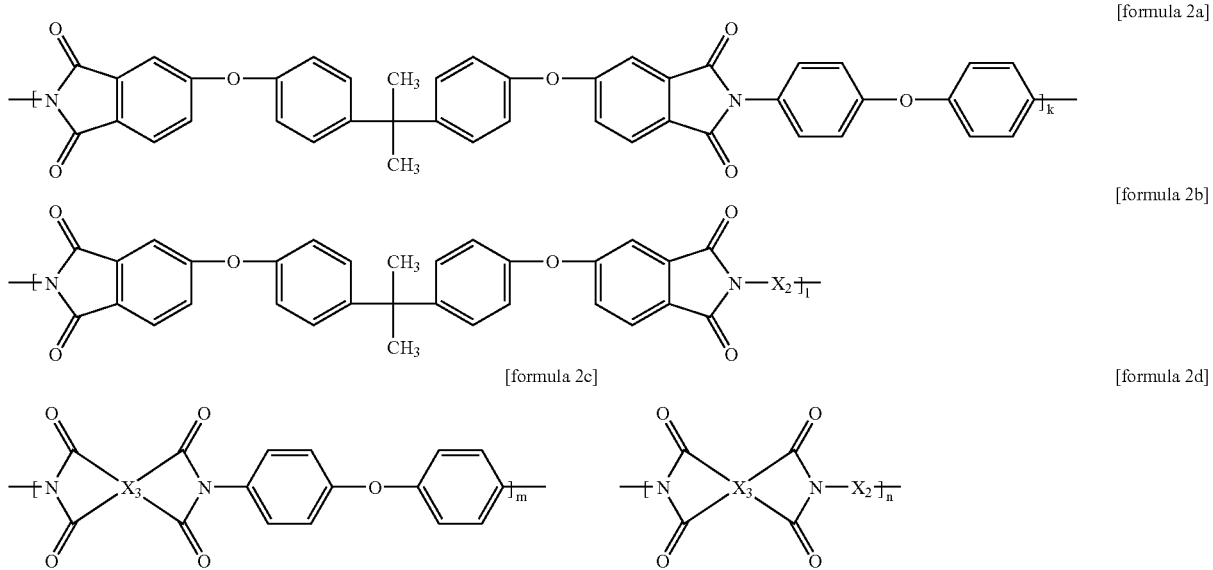

[formula 2a]

[formula 2b]

[formula 2c]

[formula 2d]

In the formulae 2a to 2d, k≧1, l, m, n≧0, l=m=n≠0, k≧1, k+l>1.5(m+n) and k+m>1.5(l+n), $X_2$ is at least one selected from the group consisting of

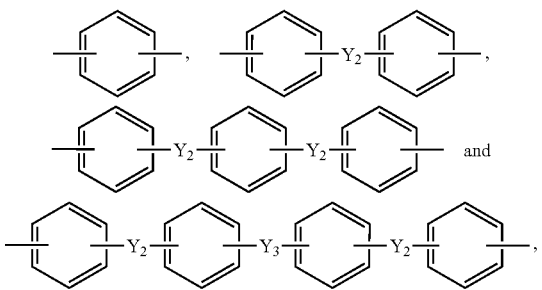

and $Y_2$ and $Y_3$ are each independently or simultaneously -, —O—, —CO—, —S—, —SO$_2$—, —C(CH$_3$)$_2$— or —CONH—, $X_3$ is and $Y_4$ is -, —O— or —CO—.

The reason why l=m=n≠0 is that if l, m and n are simultaneously 0, the fluidity of the thermoplastic polyimide is deteriorated, whereby the temperature of the lamination process is raised and the rate is reduced. Also, the reason why k≧1, k+l>1.5(m+n) and k+m>1.5(l+n) is that if k<l or k+m>1.5(l+n), the thermoplastic polyimide has the chemical resistance deteriorated and thereby, is not suitable for a resin layer of a metallic laminate for a circuit board, while if k+l<1.5(m+n), the glass transition temperature is raised to over 250° C. and thereby, the lamination with the metal is non-efficient.

The thermoplastic polyimide is more preferably a copolymer of the formulae 2a to 2d, in which m, n=0 and $X_2$ is the formula 3 or a copolymer of the formulae 2a to 2d, in which m, n=0 and $X_2$ is the formula 4.

[formula 3]

[formula 4]

A monomer for a resin layer of the above described low expansion polyimide and a resin layer of the above-described thermoplastic polyimide may be at least one selected from the group consisting of tetracarboxylic acid dianhydrides such as pyromellitic acid dianhydride (PMDA), 3,3',4,4'-biphenyl tetracarboxylic acid dianhydirde (BPDA), 4,4'-oxy di-(phthalic acid anhydride) (ODPA), 3,3',4,4'-benzophenon-tetracarboxylic acid dianhydirde (BTDA) and trimellitic acid ethylene glycol dianhydride (TMEG). Also, it may be at least one selected from the group consisting of aromatic diamines such as 1,3-phenyldiamine (MPDA), 3,4'-oxi-dianiline (3,4'-ODA), 4,4'-diaminobenzanilid (DABA), 3,3'-dihydroxy-4,4'-diaminobiphenyl (HAB), 1,4-di(4-aminophenyl) butane (DAPB), 1,3-bis(3-aminlphenoxy)benzene (APB), 4,4'-(1,3-phenylene diisopropylidene)dianiline (PDPDA), 2,2-bis[4-(4-aminophenoxy)phenyl]propane (BAPP) and bis ([4-(3-aminophenoxy)phenyl]sulfone (BAPSM).

Also, the double-sided metallic laminate according to the present invention may further comprise an additional adhesive layer between the metal layer at one side and the resin layer of a low expansion polyimide to further improve the adhesion of the metallic layer at one side and a resin layer of a low expansion polyimide. By the inclusion of the additional adhesive layer it is possible to simultaneously improve the properties such as size stability, moisture absorption, adhesion and the like, which are required for a flexible printed-circuit board.

The adhesive layer to improve the adhesion to the metal may be a resin layer of a polyimide containing a functional group having an affinity for the metal or a resin layer which can readily flow into the prominence and depression of the metal upon the lamination on the metal to be mechanically engaged with the metal.

It is known that the functional group having an affinity for the metal is —NH— group. Therefore, according to the present invention, the resin layer to improve the adhesion to the metal is preferably formed of a polyimide containing a —NH— group, more preferably a polyimide having the formula 5 introduced.

[formula 5]

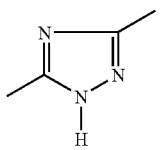

Also, the resin layer which can readily flow into the prominence and depression of the metal upon the lamination on the metal to be mechanically engaged is preferably formed of a thermoplastic polyimide of the formulae 2a, 2b, 2c and 2d.

The two metallic layers, upon which the resin layers are laminated according to the present invention, are preferably formed of copper.

Also, the present invention provides a method for manufacturing a double-sided metallic laminate comprising simultaneously or sequentially applying a precursor of a low thermal expansion polyimide having a thermal expansion coefficient of $5 \times 10^{-6}$ to $2.5 \times 10^{-5}$/°C. and a precursor of a thermoplastic polyimide; or a precursor of a polyimide for improving adhesion with a metal, a precursor of a low thermal expansion polyimide having a thermal expansion coefficient of $5 \times 10^{-6}$ to $2.5 \times 10^{-5}$/°C. and a precursor of a thermoplastic polyimide, on a metal foil to form one side of the double-sided metallic laminate, followed by drying and curing, and laminating another metal foil on the surface of the resin layer of a thermoplastic polyimide of the resulting one-sided metallic laminate comprising the resin layer of a low expansion polyimide and the resin layer of a thermoplastic polyimide; or the resin layer of a polyimide for improving adhesion with a metal, the resin layer of a low expansion polyimide having a thermal expansion coefficient of $5 \times 10^{-6}$ to $2.5 \times 10^{-5}$/°C. and the resin layer of a thermoplastic polyimide sequentially laminated on the metal foil layer, to form the other side of the double-sided metallic laminate.

In order to prepare the polyimide resin layer for improving adhesion with a metal, a polyamic acid of a polyimide precursor is dissolved in an organic solvent to form a polyamic acid solution. The polyamic acid which is used for improving adhesion with a metal is preferably a polyamic acid containing a —NH— group, more preferably a polyamic acid including a compound of the formula 5. Also, as a precursor of the polyimide resin layer, it is preferably a polyamic acid including the formulae 7a, 7b, 7c and 7d, which can readily flow into the prominence and depression of the metal upon the lamination on the metal to be mechanically engaged.

[formula 7a]

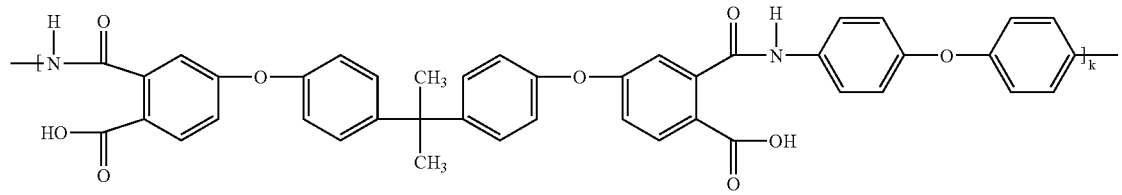

[formula 7b]

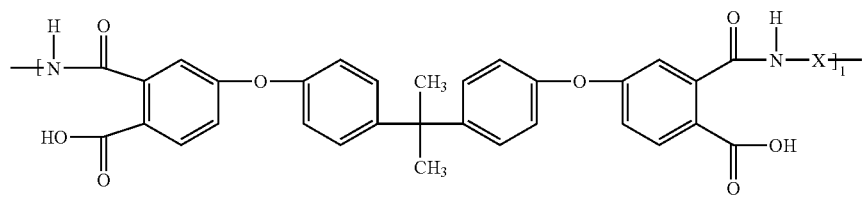

[formula 7c]

[formula 7d]

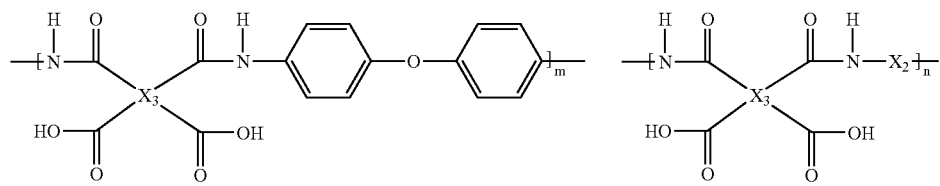

In the formulae 7a to 7d, k>1, l, m, n≧0, l=m=n≠0, k≧1, k+l>1.5(m+n) and k+m>1.5(l+n), $X_2$ is at least one selected from the group consisting of

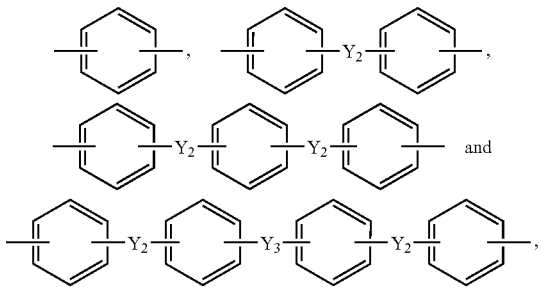

$Y_2$ and $Y_3$ are each independently or simultaneously -, —O—, —CO—, —S—, —SO$_2$—, —C(CH$_3$)$_2$— or —CONH, $X_3$ is

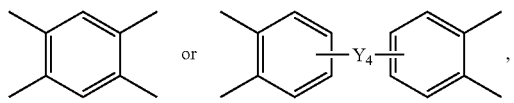

and $Y_4$ is -, —O— or CO—.

The polyamic acid is preferably 10 to 30% by weight based on the total solution. If it is less than 10% by weight, the unnecessary amount of the solvent is increased. If it exceeds 30% by weight, the viscosity of the solution is increased, which makes it difficult to produce a uniform coating. The organic solvent to dissolve the polyamic acid is preferably a solvent having a polar group such as alcohol, ether, ketone, amide, sulfur monoxide and the like. Concrete examples include N-methyl-2-pyrrolidone (NMP), N,N-dimethyl acetamide (DMAc), N,N-dimethyl formamide (DMA), dimethyl sulfoxide (DMSO) and the like, which may be used alone or as a mixture of two or more thereof.

Further, the polyamic acid solution may be prepared by further adding an additive such as an antifoaming agent, an antigelling agent, a curing accelerator to facilitate the coating and curing or to improve other properties.

The polyamic acid solution thus obtained is applied using a die coater, a comma coater, a reverse comma coater, a gravure coater and the like, preferably to a thickness after drying and curing of 1 to 5 μm. If the thickness is less than 1 μm, the adhesion to the metal cannot be attained while if it exceeds 5 μm, the thermal expansion coefficient of the resin layer of a low expansion polyimide is affected, thereby causing the curling.

After application, the coating is dried in an arch type oven, a floating type oven and the like at a temperature of lower than the boiling point of the solvent.

Also, in order to prepare the resin layer of a low expansion polyimide, a polyamic acid of a thermoplastic polyimide precursor is dissolved in an organic solvent to form a polyamic acid solution. The polyamic acid preferably comprises a copolymer of the formula 6.

[formula 6]

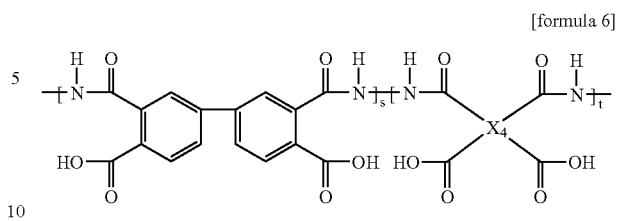

In the formula 6, s>1, t>0 and s/t=0.4~2.5, $X_4$ is

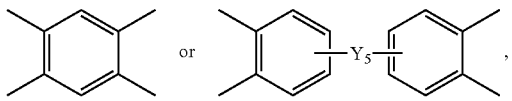

and $Y_5$ is -, —O— or —CO—.

The preparation of the polyamic acid is the same as described for the polyamide for improving adhesion with a metal layer. The prepared polyamic acid solution is applied using a die coater, a comma coater, a reverse comma coater, a gravure coater and the like, preferably to a thickness after drying and curing of 15 to 50 μm, and dried in an arch type oven, a floating type oven and the like at a temperature of lower than the boiling point of the solvent.

Also, in order to prepare the resin layer of a thermoplastic polyimide, a polyamic acid of a thermoplastic polyimide precursor is dissolved in an organic solvent to form a polyamic acid solution. The thermoplastic polyimide precursor is preferably a polymer including the formulae 7a, 7b, 7c and 7d, more preferably, a copolymer of the formulae 7a to 7d, in which m, n=0 and $X_2$ is the formula 3, or a copolymer of the formulae 7a to 7d, in which m, n=0 and $X_2$ is the formula 4. The preparation of the polyamic acid is the same as described for the low expansion polyimide. The prepared polyamic acid solution is applied using a die coater, a comma coater, a reverse comma coater, a gravure coater and the like, preferably to a thickness after drying and curing of 1 to 5 μm, and dried in an arch type oven, a floating type oven and the like at a temperature of lower than the boiling point of the solvent.

Alternatively, it is possible to simultaneously apply a solution of a precursor of a polyimide for improving adhesion with a metal, a solution of a precursor of a low thermal expansion polyimide and a solution of a precursor of a thermoplastic polyimide using a die coater, followed by drying.

As described above, precursors of a low thermal expansion polyimide and a thermoplastic polyimide; or precursors of a polyimide for improving adhesion with a metal, a low thermal expansion polyimide and a thermoplastic polyimide are applied on one side of a metal foil, dried and then cured to a temperature of 350° C. The curing is performed by slowly heating in an oven under a nitrogen atmosphere or in a vacuum, or by continuously passing through a high temperature under a nitrogen atmosphere.

After curing, on the resin layer of a thermoplastic polyimide of the one-sided metallic laminate comprising a metal foil layer, a resin layer of a low expansion polyimide and a resin layer of a thermoplastic polyimide; or a metal foil layer, a resin layer of a polyimide for improving adhesion with a metal, a resin layer of a low expansion polyimide and a resin layer of a thermoplastic polyimide, which are sequentially laminated, another metal foil to form the other side of a double-sided metallic laminate is laminated by a batch type process using a press or a continuous type process using a role.

The lamination is performed preferably at a temperature of 300 to 350° C. If it is less than 300° C., the fluidity of the thermoplastic polyimide is reduced, whereby it is impossible to attain the desired adhesion after the lamination. If it exceeds 350° C., wrinkles may form on the metal foil.

Now, the present invention will be described in further detail through the following examples, but is not limited thereto.

Meanwhile, the structures of monomers used in the Examples and Comparative examples are as follows.

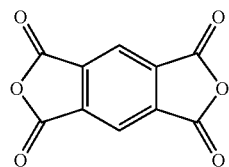

PMDA: pyromellitic acid dianhydride

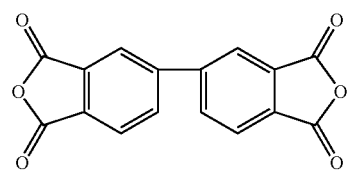

BPDA: 3,3',4,4'-biphenyl tetracarboxylic acid dianhydride

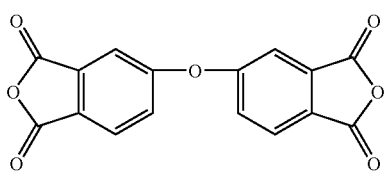

ODPA: 4,4'-oxy di-(phthalic acid anhydride)

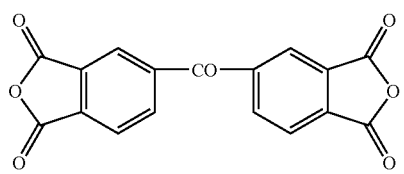

BTDA: 3,3',4,4'-benzophenon-tetracarboxylic acid dianhydride

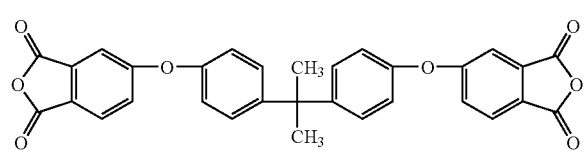

BPADA; bisphenol A dianhydride

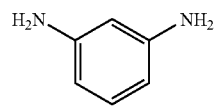

mPDA: m-phenyl diamine

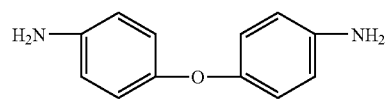

ODA: oxi-dianiline

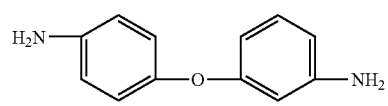

3,4'-ODA: 3,4'-oxi-dianiline

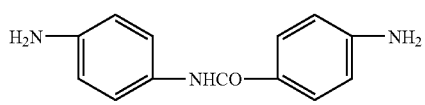

4,4'-diaminobenzanilide

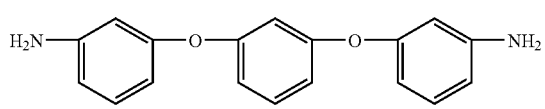

APB: 1,3-bis(3-aminophenoxy)benzene

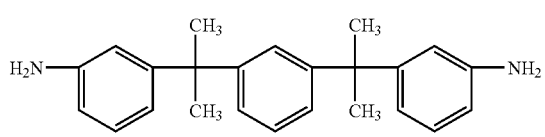

PDPDA: 4,4'-(1,3-phenylene diisopropylidene)dianiline

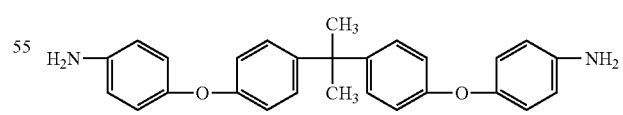

BAPP: 2,2-bis[4-(4-aminophenoxy)phenyl]propane

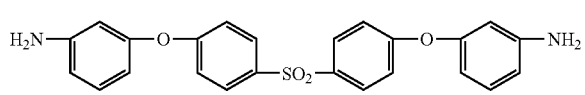

BAPSM: bis([4-(3-aminophenoxy)phenyl]sulfone

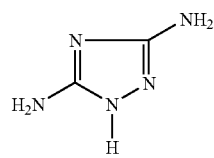

TRIAZOLE

EXAMPLES 1 TO 13 AND COMPARATIVE EXAMPLES 1 TO 2

Preparation of a Double-Sided Metallic Laminate Comprising a Resin Layer of a Low Expansion Polyimide and a Resin Layer of a Thermoplastic Polyimide

EXAMPLE 1

In order to prepare a precursor of a low thermal expansion polyimide, 500 ml of N-methyl-2-pyrrollidone was put into a flask under a nitrogen atmosphere and 7.843 g of m-PDA and 33.887 g of 4,4'-ODA were thoroughly dissolved therein. Then, while maintaining a temperature at 0° C., 21.339 g of BPDA and 36.930 g of PMDA were added thereto and stirred for 24 hours to complete the polymerization.

Meanwhile, in order to prepare a precursor of a thermoplastic polyimide, 500 ml of N-methyl-2-pyrrollidone was put into a flask under a nitrogen atmosphere and 14.625 g of ODA and 18.054 g of m-PDA were added and thoroughly dissolved therein. Then, while maintaining a temperature at 0° C., 117.321 g of BPADA was added thereto and stirred for 24 hours to complete the polymerization.

The polymerized low thermal expansion polyimide precursor was applied on a copper foil having a thickness of 12 μm to the final thickness after curing of 23 μm using a reverse comma coater and dried at 140° C. for 7 minutes. After drying, on the copper foil having the low thermal expansion polyimide precursor coated, the polymerized thermoplastic polyimide precursor was applied to the final thickness after curing of 2 μm, dried at 140° C., cured by continuously passing the product through temperatures of 180° C. for 20 minutes, 250° C. for 4 minutes and 350° C. for 8 minutes and slowly cooled to form a one-sided metallic laminate comprising a low thermal expansion polyimide and a thermoplastic polyimide sequentially laminated on a copper foil.

The prepared one-sided metallic laminate is laminated with another copper foil using a laminator at a temperature of 320° C. and a pressure of 15 kg/cm to form a double-sided metallic laminate comprising a copper foil, a resin layer of a low expansion polyimide, a resin layer of a thermoplastic polyimide and another copper foil, which are sequentially laminated. The product was examined for properties and the results are shown in Table 3.

EXAMPLES 2 TO 13 AND COMPARATIVE EXAMPLES 1 TO 2

Double-sided metallic laminates were prepared following the same method as described in Example 1, except that components of the monomers for the resin layer of a low expansion polyimide and the resin layer of a thermoplastic polyimide, their compositional ratio, thermal expansion coefficient (CTE), glass transition temperature (Tg) of and thickness of the resin layers are as described in Tables 1 and 2, and examined for properties, and the results are shown in Table 3. The adhesion among the properties was measured according to JIS C5016 and the curl was examined by measuring the curl radius of a double-sided metallic laminate with width and length of 100*100 mm.

TABLE 1

| | Resin layer of low expansion polyimide | | | | | | | | | |
|---|---|---|---|---|---|---|---|---|---|---|
| | Component | | | | Ratio (molar ratio) | | | | CTE | |
| | Anhydride (1) | Anhydride (2) | Amine (1) | Amine (2) | Anhydride (1) | Anhydride (2) | Amine (1) | Amine (2) | ($10^{-6}$/ °C.) | Thickness PI1 |
| Ex. 1 | BPDA | PMDA | PDA | ODA | 30 | 70 | 30 | 70 | 21 | 23 |
| Ex. 2 | BPDA | PMDA | PDA | ODA | 30 | 70 | 70 | 30 | 16 | 21 |
| Ex. 3 | BPDA | OPDA | PDA | — | 30 | 70 | 100 | — | 15 | 23 |
| Ex. 4 | BPDA | OPDA | PDA | — | 50 | 50 | 100 | — | 16 | 22 |
| Ex. 5 | BPDA | BTDA | PDA | — | 50 | 50 | 100 | — | 13 | 21 |
| Ex. 6 | BPDA | BTDA | PDA | — | 30 | 70 | 100 | — | 16 | 22 |
| Ex. 7 | BPDA | BTDA | PDA | — | 30 | 70 | 100 | — | 16 | 22 |
| Ex. 8 | BPDA | PMDA | PDA | — | 70 | 30 | 100 | — | 8 | 19 |
| Ex. 9 | BPDA | PMDA | PDA | — | 70 | 30 | 100 | — | 8 | 19 |
| Ex. 10 | BPDA | OPDA | PDA | — | 50 | 50 | 100 | — | 16 | 21 |
| Ex. 11 | BPDA | BTDA | PDA | — | 50 | 50 | 100 | — | 13 | 21 |
| Ex. 12 | BPDA | OPDA | PDA | — | 30 | 70 | 100 | — | 15 | 22 |
| Ex. 13 | BPDA | BTDA | PDA | — | 30 | 70 | 100 | — | 16 | 21 |
| Comp. | BPDA | PMDA | PDA | — | 70 | 30 | 100 | — | 8 | 19 |
| Comp. | BPDA | PMDA | PDA | — | 70 | 30 | 100 | — | 8 | 19 |

TABLE 2

| | Resin layer of thermoplastic polyimide | | | | | | | | | |
|---|---|---|---|---|---|---|---|---|---|---|
| | Component | | | | Ratio (molar ratio) | | | | | |
| | Anhydride (1) | Anhydride (2) | Amine (1) | Amine (2) | Anhydride (1) | Anhydride (2) | Amine (1) | Amine (2) | Tg (° C.) | Thickness P12 |
| Ex. 1 | BPADA | — | ODA | mPDA | 100 | — | 60 | 40 | 220 | 2 |
| Ex. 2 | BPADA | — | ODA | 3,4-ODA | 100 | — | 60 | 40 | 220 | 4 |
| Ex. 3 | BPADA | — | ODA | DAPB | 100 | — | 90 | 10 | 237 | 2 |
| Ex. 4 | BPADA | — | ODA | APB | 100 | — | 80 | 20 | 206 | 3 |
| Ex. 5 | BPADA | — | ODA | PDPBA | 100 | — | 70 | 30 | 208 | 4 |
| Ex. 6 | BPADA | — | ODA | BAPP | 100 | — | 70 | 30 | 205 | 3 |
| Ex. 7 | BPADA | — | ODA | BAPSM | 100 | — | 80 | 20 | 212 | 3 |
| Ex. 8 | BPADA | PMDA | ODA | — | 90 | 10 | 100 | — | 252 | 6 |
| Ex. 9 | BPADA | BPDA | ODA | — | 85 | 15 | 100 | — | 230 | 6 |
| Ex. 10 | BPADA | ODPA | ODA | — | 75 | 25 | 100 | — | 231 | 4 |
| Ex. 11 | BPADA | BTDA | ODA | — | 75 | 25 | 100 | — | 226 | 4 |
| Ex. 12 | BPADA | ODPA | ODA | BAPP | 80 | 20 | 80 | 20 | 219 | 3 |
| Ex. 13 | BPADA | BTDA | ODA | APB | 70 | 30 | 70 | 30 | 208 | 4 |
| Comp. | BTDA | — | ODA | — | 100 | — | 100 | — | 277 | 6 |
| Comp. | BPADA | — | ODA | — | 100 | — | 100 | — | 220 | 6 |

TABLE 3

| | Adhesion (kg/cm) | Curl (cm) | | |
|---|---|---|---|---|
| | | Before etching | After etching of one side | After etching both sides |
| Ex. 1 | 0.9 | ∞ | −70 | 30 |
| Ex. 2 | 1.1 | ∞ | Almost flat | 40 |
| Ex. 3 | 1.4 | ∞ | Almost flat | 45 |
| Ex. 4 | 1.3 | ∞ | 60 | Almost flat |
| Ex. 5 | 1.8 | ∞ | Almost flat | 60 |
| Ex. 6 | 1.5 | ∞ | 60 | Almost flat |
| Ex. 7 | 1.5 | ∞ | 55 | Almost flat |
| Ex. 8 | 0.6 | ∞ | Almost flat | 50 |
| Ex. 9 | 0.9 | ∞ | Almost flat | 50 |
| Ex. 10 | 1.2 | ∞ | Almost flat | 40 |
| Ex. 11 | 1.6 | ∞ | Almost flat | 60 |
| Ex. 12 | 1.4 | ∞ | 55 | Almost flat |
| Ex. 13 | 1.3 | ∞ | Almost flat | 60 |
| Comp. Ex. 1 | 0.1 | — | 40 | 10 |
| Comp. Ex. 2 | 0.2 | ∞ | Almost flat | 50 |

As shown in Table 3, the metallic laminate of Examples 1 to 13 comprising a resin layer of a low expansion polyimide and a resin layer of a thermoplastic polyimide according to the present invention showed the adhesion more excellent than Comparative examples 1 to 2 using a resin layer of a thermoplastic polyimide having a structure different from the present invention and substantially had no curl before and after etching the copper foil. In Table 3, the adhesion is more excellent as the value is higher, no curl before etching is represented by ∞, no curl after etching is represented by the flatness and no curl is substantially observed as the absolute value of the curl data is higher.

Also, according to Examples polyimide type resins could be securely laminated on a metal foil without using a conventional acryl or epoxy adhesive. Further, it was noted that the use of a polyimide type resin provided flexibility and thermal resistance.

EXAMPLES 14 TO 29 AND COMPARATIVE EXAMPLES 3 TO 4

Preparation of a Double-sided Metallic Laminate Comprising a Polyimide Resin Layer for Improving Adhesion with a Metal, a Resin Layer of a Low Expansion Polyimide and a Resin Layer of a Thermoplastic Polyimide

EXAMPLE 14

In order to prepare a polyimide precursor for improving adhesion with a metal, 500 ml of N-methyl-2-pyrrollidone (NMP) was put into a flask under a nitrogen atmosphere and 28.924 g of ODA, 14.824 g of BAPP and 0.942 g of Triazole were added and thoroughly dissolved therein. Then, while maintaining a temperature at 0° C., 12.442 g of PMDA and 42.8684 g of BTDA were added thereto and stirred for 24 hours to complete the polymerization.

In order to prepare a precursor of a low thermal expansion polyimide, 500 ml of N-methyl-2-pyrrollidone was put into a flask under a nitrogen atmosphere and 7.843 g of m-PDA and 33.887 g of 4,4'-ODA were thoroughly dissolved therein. Then, while maintaining a temperature at 0° C., 21.339 g of BPDA and 36.930 g of PMDA were added thereto and stirred for 24 hours to complete the polymerization.

Also, in order to prepare a precursor of a thermoplastic polyimide, 500 ml of N-methyl-2-pyrrollidone was put into a flask under a nitrogen atmosphere and 14.625 g of ODA and 18.054 g of m-PDA were added and thoroughly dissolved therein. Then, while maintaining a temperature at 0° C., 117.321 g of BPADA was added thereto and stirred for 24 hours to complete the polymerization.

The polymerized polyimide precursor for improving adhesion with a metal was applied on a copper foil having a thickness of 12 μm to the final thickness after curing of 1 μm using a reverse comma coater and dried at 140° C. for 2 minutes. After drying, on the copper foil having the polyimide precursor for improving adhesion with a metal coated, the polymerized low thermal expansion polyimide precursor was applied to the final thickness after curing of 22 μm and dried at 140° C. for 7 minutes. After drying, the polymerized thermoplastic polyimide precursor was applied to the final thickness after curing of 2 μm, dried at 140° C. for 10 minutes, heated to 200° C. for 6 minutes, maintained at 200° C. for 30 minutes, heated to 350° C. for 30 minutes, cured at 350° C. for 15 minutes and slowly cooled to form a one-sided metallic laminate comprising a polyimide for improving adhesion with a metal, a low thermal expansion polyimide and a thermoplastic polyimide sequentially laminated on a copper foil.

The prepared one-sided metallic laminate is laminated with another copper foil using a laminator at a temperature of 320° C. and a pressure of 15 kg/cm to form a double-sided metallic laminate comprising a copper foil, a resin layer of a polyimide for improving adhesion with a metal, a resin layer of a low expansion polyimide, a resin layer of a thermoplastic polyimide and another copper foil, which are sequentially laminated. The product was examined for properties and the results are shown in Table 7.

EXAMPLES 15 TO 29 AND COMPARATIVE EXAMPLES 3 TO 4

Double-sided metallic laminates were prepared following the same method as described in Example 1, except that components of the monomers for the resin layer of a polyimide for improving adhesion with a metal, the resin layer of a low expansion polyimide and the resin layer of a thermoplastic polyimide, their compositional ratio, thermal expansion coefficient (CTE), glass transition temperature (Tg) of and thickness of the resin layers are as described in Tables 4 to 6, and examined for properties, and the results are shown in Table 7. The adhesion among the properties was measured according to JIS C5016 and the curl was examined by measuring the curl radius of a double-sided metallic laminate with width and length of 100*100 mm.

TABLE 4

| | Resin layer for improving adhesion with metal | | | | | | | | | | | |
|---|---|---|---|---|---|---|---|---|---|---|---|---|
| | Component | | | | | Ratio (molar ratio) | | | | | CTE | |
| | Anhydride (1) | Anhydride (2) | Amine (1) | Amine (2) | Amine (3) | Anhydride (1) | Anhydride (2) | Amine (1) | Amine (2) | Amine (3) | ($10^{-6}$/° C.) | Thickness |
| Ex. 14 | PMDA | BTDA | ODA | BAPP | Triazole | 30 | 70 | 76 | 19 | 5 | 34 | 1 |
| Ex. 15 | PMDA | BTDA | ODA | BAPP | Triazole | 50 | 50 | 76 | 19 | 5 | 30 | 1 |
| Ex. 16 | BPDA | BTDA | ODA | BAPP | Triazole | 50 | 50 | 76 | 19 | 5 | 50 | 2 |
| Ex. 17 | BPDA | BTDA | ODA | BAPP | Triazole | 50 | 50 | 76 | 19 | 5 | 22 | 3 |
| Ex. 18 | PMDA | BPDA | ODA | DABA | — | 30 | 70 | 90 | 10 | — | 35 | 1 |
| EX. 19 | PMDA | BTDA | ODA | BAPP | Triazole | 30 | 70 | 76 | 19 | 5 | 34 | 3 |
| Ex. 20 | PMDA | BTDA | ODA | BAPP | Triazole | 50 | 50 | 76 | 19 | 5 | 30 | 1 |
| Ex. 21 | BPDA | BTDA | ODA | BAPP | Triazole | 50 | 50 | 76 | 19 | 5 | 50 | 4 |
| Ex. 22 | BPDA | BTDA | PDA | BAPP | Triazole | 50 | 50 | 76 | 19 | 5 | 22 | 4 |
| Ex. 23 | PMDA | BPDA | ODA | DABA | — | 30 | 70 | 90 | 10 | — | 35 | 2 |
| Ex. 24 | PMDA | BTDA | ODA | BAPP | Triazole | 30 | 70 | 76 | 19 | 5 | 34 | 2 |
| Ex. 25 | PMDA | BTDA | ODA | BAPP | Triazole | 50 | 50 | 76 | 19 | 5 | 30 | 1 |
| Ex. 26 | BPDA | BTDA | ODA | BAPP | Triazole | 50 | 50 | 76 | 19 | 5 | 50 | 2 |
| Ex. 27 | BPADA | — | ODA | mPDA | — | 100 | — | 60 | 40 | 40 | 220 | 1 |
| Ex. 28 | BPADA | — | ODA | | BAPP | 100 | — | 70 | | 30 | 205 | 3 |
| Ex. 29 | BPADA | BTDA | ODA | — | — | 75 | 25 | 100 | — | — | 226 | 3 |
| Comp. Ex. 3 | BTDA | — | ODA | — | — | 100 | — | 100 | — | — | 277 | 4 |
| Comp. Ex. 4 | BPADA | — | ODA | — | — | 100 | — | 100 | — | — | 220 | — |

TABLE 5

| | Resin layer of low expansion polyimide | | | | | | | | | |
|---|---|---|---|---|---|---|---|---|---|---|
| | Component | | | | Ratio (molar ratio) | | | | CTE | |
| | Anhydride (1) | Anhydride (2) | Amine (1) | Amine (2) | Anhydride (1) | Anhydride (2) | Amine (1) | Amine (2) | ($10^{-6}$/°C.) | Thickness |
| Ex. 14 | BPDA | PMDA | PDA | ODA | 30 | 70 | 30 | 70 | 21 | 22 |
| Ex. 15 | BPDA | PMDA | PDA | ODA | 30 | 70 | 70 | 30 | 16 | 21 |
| Ex. 16 | BPDA | ODPA | PDA | — | 30 | 70 | 100 | — | 16 | 20 |
| Ex. 17 | BPDA | ODPA | PDA | — | 50 | 50 | 100 | — | 16 | 19 |
| Ex. 18 | BPDA | BTDA | PDA | — | 50 | 50 | 100 | — | 13 | 20 |
| Ex. 19 | BPDA | BTDA | PDA | — | 30 | 70 | 100 | — | 16 | 19 |
| Ex. 20 | BPDA | BTDA | PDA | — | 30 | 70 | 100 | — | 16 | 20 |
| Ex. 21 | BPDA | PMDA | PDA | — | 70 | 30 | 100 | — | 8 | 16 |
| Ex. 22 | BPDA | PMDA | PDA | — | 70 | 30 | 100 | — | 8 | 16 |
| Ex. 23 | BPDA | ODPA | PDA | — | 50 | 50 | 100 | — | 16 | 20 |
| Ex. 24 | BPDA | BTDA | PDA | — | 50 | 50 | 100 | — | 13 | 19 |
| Ex. 25 | BPDA | ODPA | PDA | — | 30 | 70 | 100 | — | 16 | 20 |
| Ex. 26 | BPDA | BTDA | PDA | — | 30 | 70 | 100 | — | 16 | 20 |
| Ex. 27 | BPDA | PMDA | PDA | ODA | 30 | 70 | 30 | 70 | 21 | 22 |
| Ex. 28 | BPDA | BTDA | PDA | — | 50 | 50 | 100 | — | 13 | 20 |
| Ex. 29 | BPDA | BTDA | PDA | — | 30 | 70 | 100 | — | 16 | 19 |
| Comp. | BPDA | PMDA | PDA | — | 70 | 30 | 100 | — | 8 | 16 |
| Comp. | BPDA | PMDA | PDA | — | 70 | 30 | 100 | — | 8 | 19 |

TABLE 6

| | Resin layer of thermoplastic polyimide | | | | | | | | | |
|---|---|---|---|---|---|---|---|---|---|---|
| | Component | | | | Ratio (molar ratio) | | | | | |
| | Anhydride (1) | Anhydride (2) | Amine (1) | Amine (2) | Anhydride (1) | Anhydride (2) | Amine (1) | Amine (2) | Tg (°C.) | Thickness |
| Ex. 14 | BPADA | — | ODA | mPDA | 100 | — | 60 | 40 | 220 | 2 |
| Ex. 15 | BPADA | — | ODA | 3,4'-ODA | 100 | — | 60 | 40 | 220 | 3 |
| Ex. 16 | BPADA | — | ODA | DAPB | 100 | — | 90 | 10 | 237 | 3 |
| Ex. 17 | BPADA | — | ODA | APB | 100 | — | 80 | 20 | 206 | 3 |
| Ex. 18 | BPADA | — | ODA | PDPBA | 100 | — | 70 | 30 | 208 | 4 |
| Ex. 19 | BPADA | — | ODA | BAPP | 100 | — | 70 | 30 | 205 | 3 |
| Ex. 20 | BPADA | — | ODA | BAPSM | 100 | — | 80 | 20 | 212 | 4 |
| Ex. 21 | BPADA | PMDA | ODA | — | 90 | 10 | 100 | — | 252 | 5 |
| Ex. 22 | BPADA | BPDA | ODA | — | 85 | 15 | 100 | — | 230 | 5 |
| Ex. 23 | BPADA | ODPA | ODA | — | 75 | 25 | 100 | — | 231 | 3 |
| Ex. 24 | BPADA | BTDA | ODA | — | 75 | 25 | 100 | — | 226 | 4 |
| Ex. 25 | BPADA | ODPA | ODA | BAPP | 80 | 20 | 80 | 20 | 219 | 4 |

TABLE 6-continued

| | Resin layer of thermoplastic polyimide | | | | | | | | | |
|---|---|---|---|---|---|---|---|---|---|---|
| | Component | | | | Ratio (molar ratio) | | | | | |
| | Anhydride (1) | Anhydride (2) | Amine (1) | Amine (2) | Anhydride (1) | Anhydride (2) | Amine (1) | Amine (2) | Tg (° C.) | Thickness |
| Ex. 25 | | | | | | | | | | |
| Ex. 26 | BPADA | BTDA | ODA | APB | 70 | 30 | 70 | 30 | 208 | 3 |
| Ex. 27 | BPADA | — | ODA | 3,4'-ODA | 100 | — | 60 | 40 | 220 | 2 |
| Ex. 28 | BPADA | — | ODA | BAPSM | 100 | — | 80 | 20 | 212 | 3 |
| Ex. 29 | BPADA | — | ODA | 3,4'-ODA | 100 | — | 60 | 40 | 220 | 3 |
| Comp. | BTDA | — | ODA | — | 100 | — | 100 | — | 277 | 5 |
| Comp. | BPADA | — | ODA | — | 100 | — | 100 | — | 220 | 6 |

TABLE 7

| | Adhesion (kg/cm) | | Curl (cm) | | | |
|---|---|---|---|---|---|---|
| | Adhesion part with metal | Adhesion part with thermoplastic polyimide | Before etching | After etching adhesion part with metal | After etching adhesion part with thermoplasticpolyimide | After etching both sides |
| Ex. 14 | 1.0 | 0.9 | ∞ | 20 | Almost flat | 10 |
| Ex. 15 | 0.8 | 1.1 | ∞ | Almost flat | Almost flat | Almost flat |
| Ex. 16 | 1.1 | 1.4 | ∞ | Almost flat | Almost flat | Almost flat |
| Ex. 17 | 0.8 | 1.3 | ∞ | Almost flat | Almost flat | Almost flat |
| Ex. 18 | 0.8 | 1.8 | ∞ | Almost flat | Almost flat | Almost flat |
| Ex. 19 | 1.0 | 1.5 | ∞ | Almost flat | Almost flat | Almost flat |
| Ex. 20 | 0.8 | 1.5 | ∞ | Almost flat | Almost flat | Almost flat |
| Ex. 21 | 1.1 | 0.6 | ∞ | 25 | 25 | Almost flat |
| Ex. 22 | 0.8 | 0.9 | ∞ | Almost flat | 15 | 3 |
| Ex. 23 | 0.8 | 1.2 | ∞ | Almost flat | Almost flat | Almost flat |
| Ex. 24 | 1.0 | 1.6 | ∞ | Almost flat | Almost flat | 25 |
| Ex. 25 | 0.8 | 1.4 | ∞ | Almost flat | Almost flat | 20 |
| Ex. 26 | 1.1 | 1.3 | ∞ | Almost flat | Almost flat | Almost flat |
| Ex. 27 | 0.9 | 1.1 | ∞ | 15 | 20 | 5 |
| Ex. 28 | 1.5 | 1.5 | ∞ | Almost flat | Almost flat | Almost flat |
| Ex. 29 | 1.6 | 1.1 | ∞ | Almost flat | Almost flat | Almost flat |
| Comp. Ex. 3 | 0.8 | 0.1 | ∞ | 12 | 18 | Almost flat |
| Comp. Ex. 4 | 0.6 | 0.2 | ∞ | Almost flat | 4 | 0.5 |

As shown in Table 7, the metallic laminate of Examples 14 to 29 comprising a resin layer of a polyimide for improving adhesion with a metal, a resin layer of a low expansion polyimide and a resin layer of a thermoplastic polyimide according to the present invention showed the adhesion more excellent than Comparative examples 3 to 4 using a resin layer of a polyimide for improving adhesion with a metal and a resin layer of a thermoplastic polyimide having a structure different from the present invention and substantially had no curl before and after etching the copper foil. In Table 7, the adhesion is more excellent as the value is higher, no curl before etching is represented by ∞, no curl after etching is represented by the flatness and no curl is substantially observed as the absolute value of the curl data is higher.

Also, according to Examples polyimide type resins could be securely laminated on a metal foil without using a conventional acryl or epoxy adhesive. Further, it was noted that the use of a polyimide type resin provided flexibility and thermal resistance.

INDUSTRIAL APPLICABILITY

As described above, the double-sided metallic laminate according to the present invention, which is securely laminated without the use of an adhesive, has excellent flexibility and thermal resistance and can prevent curl, is a useful invention suitably applicable to a printed circuit board of a small size electric appliance.

What is claimed is:

1. A double-sided metallic laminate comprising a metallic layer at one side, a resin layer of a low expansion polyimide having a thermal expansion coefficient of $5 \times 10^{-6}$ to $2.5 \times 10^{-5}/°C.$, a resin layer of a thermoplastic polyimide and a metallic layer at the other side, wherein the thermoplastic polyimide has a glass transition temperature of 200 to 250° C. and is a copolymer including the following formula 2a, formula 2b, formula 2c and formula 2d:

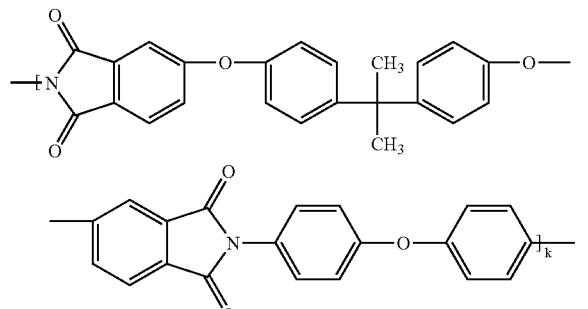

[formula 2a]

[formula 2b]

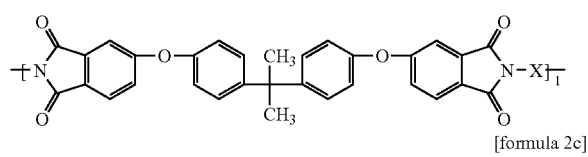

[formula 2c]

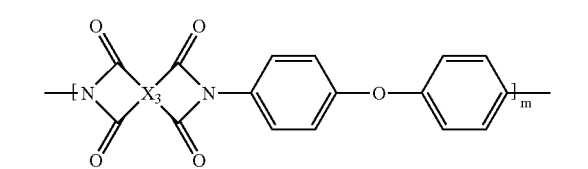

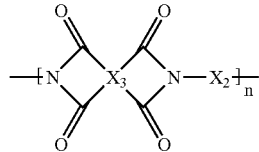

[formula 2d]

in which, $k \geq 1$, l, m, $n \geq 0, l=m=n \neq 0$, $k \geq 1$, $k+l>1.5(m+n)$ and $k+m>1.5(l+n)$, $X_2$ is at least one selected from the consisting of

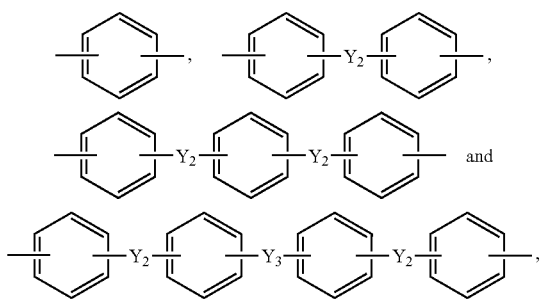

$Y_2$ and $Y_3$ are each independently or simultaneously -, —O—, —CO—, —S—, —SO$_2$—, —C(CH$_3$)$_2$— or —CONH—, $X_3$ is

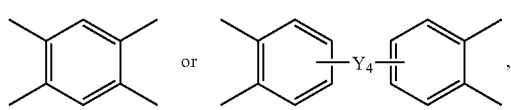

and $Y_4$ is -, —O— or —CO—.

2. The double-sided metallic laminate according to claim 1, wherein the low thermal expansion polyimide is the following formula 1:

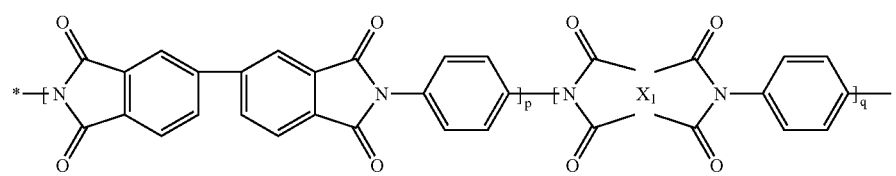

[formula 1]

in which, p>1, q>0 and p/q=0.4~2.5,
X₁ is

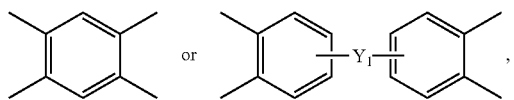

and
Y₁ is —O— or —CO—.

3. The double-sided metallic laminate according to claim 1, wherein the thermoplastic polyimide is the formulae 2a to 2d, in which m, n=0 and X₂ is the following formula 3:

[formula 3]

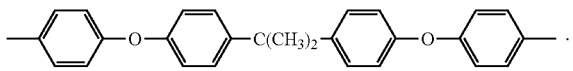

4. The double-sided metallic laminate according to claim 1, wherein the thermoplastic polyimide is the formulae 2a to 2d, in which m, n=0 and X₂ is the following formula 4:

[formula 4]

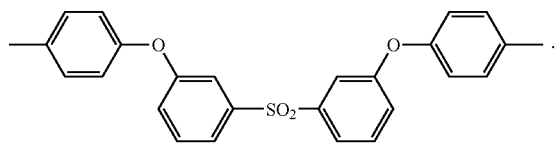

5. The double-sided metallic laminate according to claim 1, wherein the metallic layer is formed of copper.

6. The double-sided metallic laminate according to claim 1, which further comprises a polyimide resin layer for improving adhesion with a metal between the metallic layer at one side and the resin layer of the low expansion polyimide.

7. The double-sided metallic laminate according to claim 6, wherein the polyimide for improving adhesion with a metal is a polyimide having a —NH— functional group introduced.

8. The double-sided metallic laminate according to claim 6, wherein the polyimide for improving adhesion with a metal is a polyimide having the following formula 5 introduced:

[formula 5]

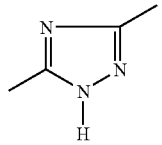

9. The double-sided metallic laminate according to claim 6, wherein the polyimide for improving adhesion with a metal is a copolymer including the formula 2a, formula 2b, formula 2c and formula 2d.

10. A method for manufacturing a double-sided metallic laminate comprising simultaneously or sequentially applying a precursor of a low thermal expansion polyimide having a thermal expansion coefficient of $5\times10^{-6}$ to $2.5\times10^{-5}/°$ C. and a precursor of a thermoplastic polyimide on a metal foil to form one side of the double-sided metallic layer, followed by drying and curing, and laminating another metal foil on the resin layer of a thermoplastic polyimide of the resulting one-sided metallic laminate comprising a metal foil layer, a resin layer of a low expansion polyimide and a resin layer of a thermoplastic polyimide, which are sequentially laminated, to form the other side of the double-sided metallic laminate;

wherein the thermoplastic polyimide has a glass transition temperature of 200 to 250 ° C.;

wherein the precursor of a thermoplastic polyimide is a copolymer including the following formula 7a, formula 7b, formula 7c and formula 7d:

[formula 7a]

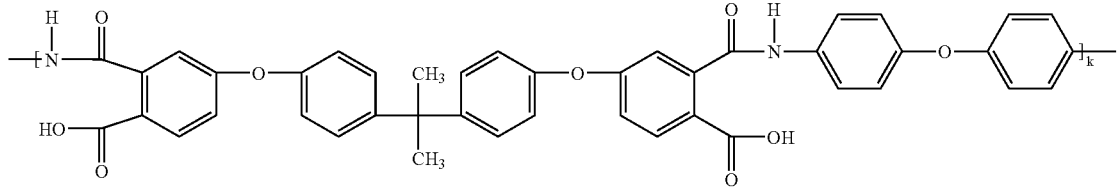

[formula 7b]

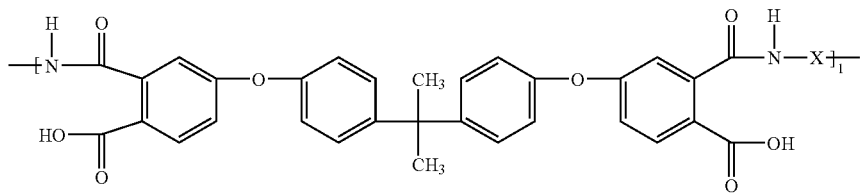

[formula 7c]     formula 7d

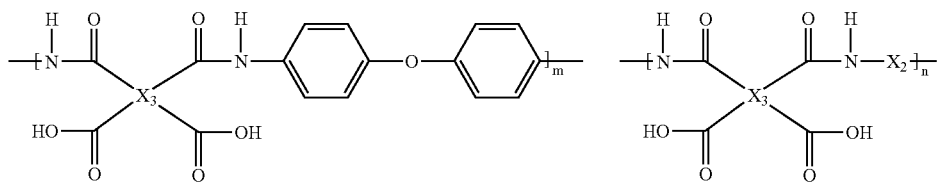

in which, k≧1, l, m, n≧0,l=m=n≠0, k≧1, k+l>1.5(m+n) and k=m>1.5(l+n), $X_2$ is at least one selected from the group consisting of,

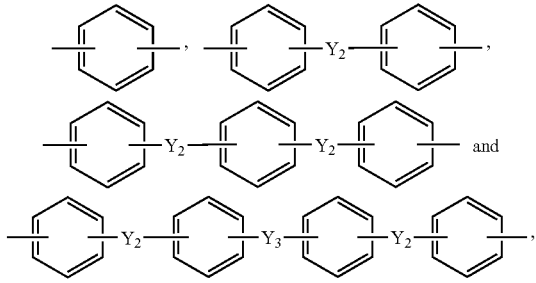

$Y_2$ and $Y_3$ are each independently or simultaneously -, —O—, —CO—, —S—, —SO$_2$—, —C(CH$_3$)$_2$— or —CONH—, $X_3$ is

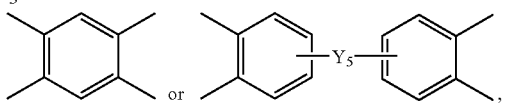

and $Y_4$ is -, —O— or —CO—.

11. The method according to claim 10, wherein the precursor of a low thermal expansion polyimide is a copolymer of the following formula 6:

[formula 6]

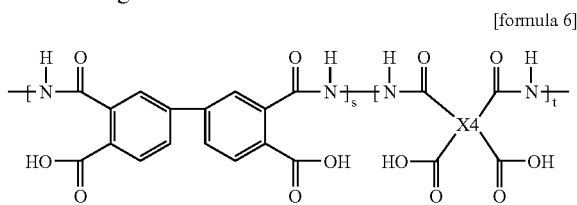

in which, s>1, t>0 and s/t=0.4~2.5, $X_4$ is

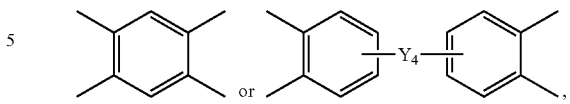

and $Y_5$ is -, —O— or —CO—.

12. The method according to claim 10, wherein the precursor of a thermoplastic polyimide is the formulae 7a to 7d, in which m, n=0 and $X_2$ is the formula 3.

13. The method according to claim 10, wherein the precursor of a thermoplastic polyimide may be the formulae 7a to 7d, in which m, n=0 and $X_2$ is the formula 4.

14. A method for manufacturing a double-sided metallic laminate comprising simultaneously or sequentially applying a precursor of a polyimide for improving adhesion with a metal, a precursor of a low thermal expansion polyimide having a thermal expansion coefficient of $5 \times 10^{-6}$ to $2.5 \times 10^{-5}/°$ C. and a precursor of a thermoplastic polyimide on a metal foil to form one side of the double-sided metallic layer, followed by drying and curing, and laminating another metal foil on the resin layer of a thermoplastic polyimide of the resulting one-sided metallic laminate comprising a metal foil layer, a resin layer of a low expansion polyimide and a resin layer of a thermoplastic polyimide, which are sequentially laminated, to form the other side of the double-sided metallic laminate wherein the thermoplastic polyimide has a glass transition temperature of 200 to 250° C.;

wherein the precursor of a thermoplastic polyimide is a copolymer including the following formula 7a, formula 7b, formula 7c and formula 7d:

[formula 7a]

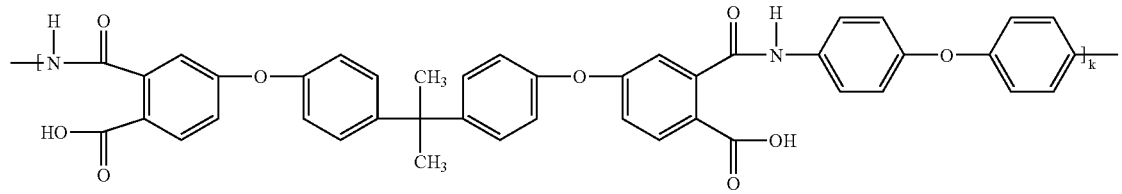

[formula 7b]

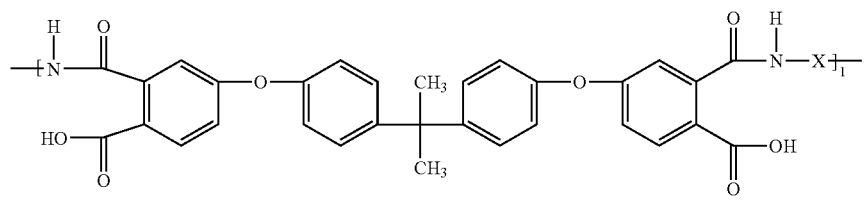

[formula 7c]           formula 7d]

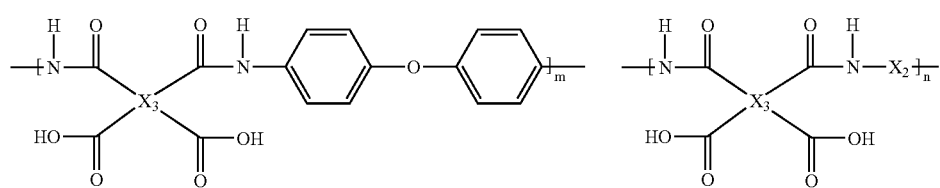

in which k≧1, l, m, n≧0, l=m=n≠0, k≧1, k+l>1.5(m+n) and k+m>1.5(l+n),

X$_2$ is at least one selected from the group consisting of

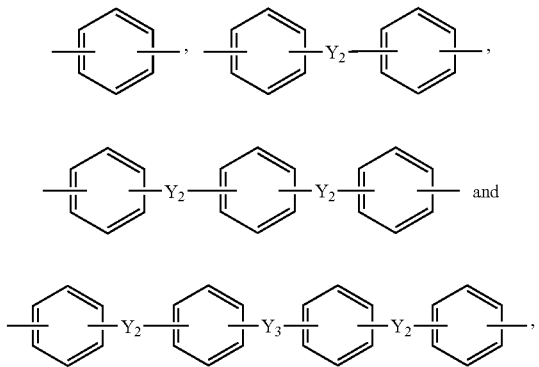

Y$_2$ and Y$_3$ are each independently or simultaneously -, —O—, —CO—, —S—, —SO$_2$—, —C(CH$_3$)$_2$— or —CONH—, X$_3$ is

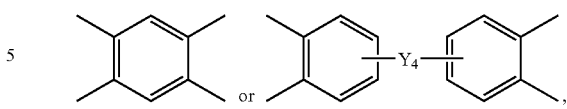

and

Y$_4$ is -, —O— or —CO—.

15. The method according to claim 14, wherein the precursor of a polyimide for improving adhesion with a metal is a precursor of a polyimide having a —NH— functional group introduced.

16. The method according to claim 14, wherein the precursor of a polyimide for improving adhesion with a metal is a precursor of a polyimide having the formula 5 introduced.

17. The method according to claim 14, wherein the precursor of a polyimide for improving adhesion with a metal is a copolymer including formula 7a, formula 7b, formula 7c and formula 7d.

* * * * *